(12) United States Patent
Jang et al.

(10) Patent No.: US 6,693,294 B1
(45) Date of Patent: Feb. 17, 2004

(54) SCHOTTKY BARRIER TUNNEL TRANSISTOR USING THIN SILICON LAYER ON INSULATOR AND METHOD FOR FABRICATING THE SAME

(75) Inventors: Moon-Gyu Jang, Daejeon (KR); Seong-Jae Lee, Daejeon (KR); Woo-Seok Cheong, Daejeon (KR); Won-Ju Cho, Daejeon (KR); Kyoung-Wan Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 10/331,945

(22) Filed: Dec. 31, 2002

(30) Foreign Application Priority Data

Aug. 12, 2002 (KR) .......................................... 2002-47506

(51) Int. Cl.[7] .............................................. H01L 39/00
(52) U.S. Cl. ..................... 257/30; 257/192; 257/347; 257/349; 438/149; 438/570
(58) Field of Search ..................... 257/25, 30, 183, 257/192, 280, 281, 347, 349; 438/149, 164, 167, 570, 581, 583

(56) References Cited

U.S. PATENT DOCUMENTS 5,120,666 A * 6/1992 Gotou ........................ 437/40
5,188,973 A * 2/1993 Omura et al. ................. 437/40
6,198,113 B1 * 3/2001 Grupp ......................... 257/39
6,207,530 B1 * 3/2001 Hsu et al. .................... 438/404
6,339,005 B1 1/2002 Bryant et al.
6,423,578 B2 * 7/2002 Maeda ....................... 438/118

FOREIGN PATENT DOCUMENTS

KR 2000-25576 5/2000 ........... H01L/27/08

* cited by examiner

Primary Examiner—Sara Crane
(74) Attorney, Agent, or Firm—Jacobson Holman PLLC

(57) ABSTRACT

Provided are a Schottky barrier tunnel transistor (SBTT) and a method of fabricating the same. The SBTT includes a buried oxide layer formed on a base substrate layer and having a groove at its upper surface; an ultra-thin silicon-on-insulator (SOI) layer formed across the groove; an insulating layer wrapping the SOI layer on the groove; a gate formed to be wider than the groove on the insulating layer; source and drain regions each positioned at both sides of the gate, the source and drain regions formed of silicide; and a conductive layer for filling the groove. In the SBTT, the SOI layer is formed to an ultra-thin thickness to minimize the occurrence of a leakage current, and a channel in the SOI layer below the gate is completely wrapped by the gate and the conductive layer, thereby improving the operational characteristics of the SBTT.

15 Claims, 6 Drawing Sheets

US 6,693,294 B1

SCHOTTKY BARRIER TUNNEL TRANSISTOR USING THIN SILICON LAYER ON INSULATOR AND METHOD FOR FABRICATING THE SAME

BACKGROUND OF THE INVENTION

This application claims the priority of Korean Patent Application No. 2002-47506, filed on Aug. 12, 2002 in the Korean Intellectual Property Office, which is incorporated herein in its entirety by reference.

1. Field of the Invention

The present invention relates to a transistor and a method of fabricating the same, and more particularly, to a Schottky barrier tunnel transistor (hereinafter, referred to as "SBTT") using a Schottky barrier formed between metal and a semiconductor, and a method of fabricating the same.

2. Description of the Related Art

Advances in the techniques of fabricating semiconductor devices result in the development of a transistor having a short channel of 100 nm or less. Therefore, the characteristics of a semiconductor device, which operates according to the laws of classic electrodynamics, are now governed by quantum mechanics. In this case, a leakage current, however, is extremely increased due to short channel effect in a transistor. Thus, there is a need to prevent a short channel effect from occurring in such a transistor.

To suppress the occurrence of the short channel effect, junction depth of source and drain regions must be within the range from a quarter to one third of the channel length of a transistor. Extensive research is continuously conducted to reduce the junction depth of source and drain regions with low accelerating voltage, using a general ion implantation method, but it is almost impossible to regularly and shallowly form the junction depth to 30 nm or less. Meanwhile, a reduction in the junction depth results in an increase in parasitic resistance. For instance, if a doping concentration is 1E19 cm$^{-3}$ and junction depth is 10 nm, a sheet resistance value exceeds more than 500 $\Omega/\square$ and a signal delay would be caused.

Accordingly, an increase in the permittivity of a gate oxide layer, as well as a shallow junction depth, is required to suppress the occurrence of the short channel effect. To increase the permittivity of a gate oxide layer, a rare-earth oxide layer is used as a better alternative than a silicon oxide layer. However, the rare-earth oxide layer is thermally unstable and thus is not proper to be processed at a high temperature, unlike the silicon oxide layer. For the use of the rare-earth oxide layer, a process temperature is required to be remarkably reduced when fabricating a semiconductor device, but a great reduction in the process temperature will place a limit on the thermal treatment for doping activation and recovery of damaged crystals.

A SBTT is known as a transistor that has shallow junction depth and enables a gate oxide layer with high permittivity. Shallow junction depth is considered the most important factor in scaling down a metal-oxide-semiconductor field effect transistor (MOSFET). The SBTT is made by replacing source and drain regions of the MOSFET with metal or silicide, in which a sheet resistance value is reduced from one tenth to one fiftieth of that of a general transistor. Therefore, the operational speed of the SBTT is improved, and the channel length is reduced to 35 nm or less. Also, ion implantation is not carried out when fabricating the SBTT, and therefore the subsequent thermal treatment is not needed. For this reason, the SBTT is compatible with fabricating a transistor adopting a gate oxide layer of high permittivity. Further, the SBTT is fabricated using a lower thermal process than a general transistor and thus fabrication of the SBTT is compatible with a process of fabricating a transistor having a metallic gate electrode.

In general, a bulk silicon substrate is mainly used in fabricating a SBTT or conducting research into the operational characteristics of the SBTT. However, the use of a bulk silicon substrate causes a great number of silicon atoms to diffuse into the suicide during the formation of silicide source and drain regions, thereby causing a lot of vacancies in the crystalline bulk silicon substrate. The vacancies are generally densely formed in a space charge region and act as interface impurities that generate leakage current.

To prevent the formation of vacancies, it is suggested that the SBTT be fabricated with a silicon-on-insulator (SOI) substrate. However, in the SBTT formed on the SOI substrate, an interface between a buried oxide layer and an SOI layer becomes a path through which a leakage current is generated.

SUMMARY OF THE INVENTION

To solve the above problem, it is one aspect of the present invention to provide a SBTT in which generation of short channel effect and a leakage current are prevented.

It is another aspect of the present invention to provide a method of fabricating such a SBTT.

To achieve one aspect of the present invention, there is provided a Schottky barrier tunnel transistor (SBTT) including a buried oxide layer formed on a base substrate layer and having a groove at its upper surface; an ultra-thin silicon-on-insulator (SOI) layer formed across the groove; an insulating layer wrapping the SOI layer on the groove; a gate formed to be wider than the groove on the insulating layer; source and drain regions each positioned at both sides of the gate, the source and drain regions formed of silicide; and a conductive layer for filling the groove.

Preferably, the SOI layer is formed to a thickness of about 50 nm or less.

The conductive layer and the gate may be formed of doped polysilicon. Otherwise, the conductive layer may be formed of doped polysilicon and the gate may be formed of silicide.

An insulating spacer and a hard mask layer may be further formed on sidewalls of the gate and on the gate, respectively.

Preferably, the bottoms of the source and drain regions contact the buried oxide layer.

As mentioned above, the SBTT according to the present invention is fabricated using a Schottky barrier. The Schottky barrier is formed between metal and a semiconductor and is made by forming silicide source and drain regions on a thin SOI layer. The SOI layer is formed to an ultra-thin thickness to minimize leakage current, and a channel in the SOI layer below a gate is completely wrapped by the gate and a conductive layer, thereby improving the operational characteristics of the SBTT.

To achieve another aspect of the present invention, there is provided a method of fabricating an SBTT, including making a substrate on which a base substrate layer, a buried oxide layer, and an ultra-thin SOI layer are sequentially formed; patterning the SOI layer to define two wide regions, as source and drain regions, and a narrow channel region between the two wide regions; forming a groove by removing a portion of the buried oxide layer that contacts the channel region; thermally oxidizing the remaining SOI layer to form an insulating layer, the insulating layer wrapping the channel region; depositing a conductive material for a gate on the insulating layer while filling the groove with the conductive material; patterning the conductive material and the insulating layer to form a gate and a gate oxide layer across the channel region, the gate and the gate oxide layer being formed to be wider than the groove; and forming source and drain regions on the two wide regions using silicide.

The SOI layer is formed to a thickness such that an electric field controlled by the gate can completely control the channel region.

Forming a groove includes forming a photoresist on the remaining SOI layer; performing exposure and development on the photoresist to form an opening that is wider than the channel region; removing a predetermined thickness of the buried oxide layer exposed via the opening and having an etch selectivity with respect to the SOI layer; and removing the photoresist entirely.

Forming the gate and the gate oxide layer includes forming a hard mask layer on the conductive material to be wider than the groove and across the channel region; and patterning the conductive material and the insulating layer using the hard mask layer.

Forming the source and drain regions includes depositing a refractory metal layer on the resultant structure on which the gate is formed; and forming a self-aligned silicide layer by thermally treating the substrate and reacting silicon of the two wide regions.

The SBTT according to the present invention has a silicon-on-insulator (SOI) layer of a wrap structure, in which a portion of a buried oxide layer underlying a channel region is selectively removed to form a groove and the groove is filled with a conductive material for a gate, thereby preventing leakage current from occurring in an SOI substrate via the buried oxide layer.

BRIEF DESCRIPTION OF THE DRAWINGS

The above aspects and advantages of the present invention will become more apparent by describing in detail preferred embodiments thereof with reference to the attached drawings in which.

DETAILED DESCRIPTION OF THE INVENTION

Figure 1:
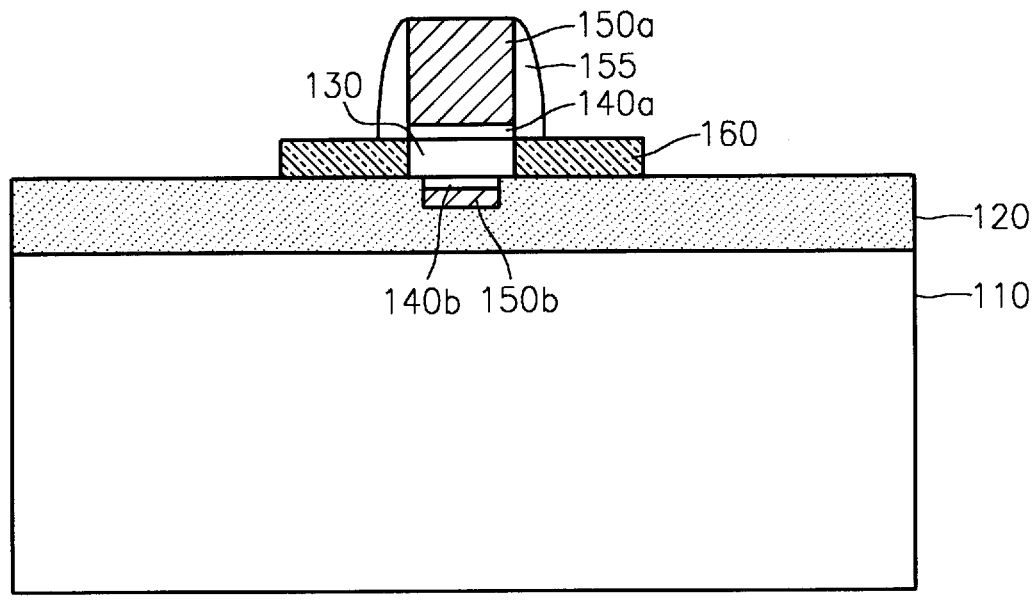
FIG. 1 is a cross-sectional view of a Schottky barrier tunnel transistor (SBTT) according to a preferred embodiment of the present invention.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. In the drawings, the thickness of layers and regions are exaggerated for clarity. The same reference numerals in different drawings represent the same element, and thus their descriptions will not be repeated.

FIG. 1 is a cross-sectional view of a SBTT according to a preferred embodiment of the present invention. Referring to FIG. 1, source and drain regions 160 are formed of silicide that is a composition of silicon and metal. The metal for the suicide may be cobalt (Co), tungsten (W), nickel (Ni), palladium (Pd), platinum (Pt), or titanium (Ti). A silicon-on-insulator (SOI) layer 130, which acts as a channel, has a wrap structure in which a portion of a buried oxide layer 120 contacting the SOI layer 130 is removed to a predetermined thickness to form a groove, and the groove is filled with a conductive layer 150b. The conductive layer 150b is formed of doped polysilicon, which is also a substance for a gate 150a, and effectively prevents a leakage current from occurring at an interface between the buried oxide layer 120 and the SOI layer 130.

The SOI layer 130, which acts a channel, has a structure wrapped by first and second insulting layers 140a and 140b. In detail, the first insulating layer 140a on the SOI layer 130 acts as a gate oxide layer, and the second insulating layer 140b below the SOI layer 130 insulates the gate 150a and the conductive layer 150b.

If the SOI layer 130 is thinly formed to a thickness of 50 nm or less, the thickness of a channel, which is controlled by the gate 150a, becomes reduced, and the formation of an inversion layer can be very easily controlled. As a result, a leakage current formed between source and drain regions of the SBTT is reduced. It is more preferable that the bottom of the source and drain regions 160 contacts the buried oxide layer 120 so as to reduce the leakage current.

The SBTT of FIG. 1 is formed on a base substrate layer 110 that serves as a mechanical base frame of the SBTT. An insulating spacer 155 is formed on the sidewalls of the gate 150a to prevent short circuiting between the gate 150a and the source and drain regions 160. The insulating spacer 155 is formed of nitride or oxide. If necessary, a hard mask layer (not shown) may be further formed on the gate 150a to protect the gate 150a.

In this embodiment, the conductive layer 150b and the gate 150a are described as being formed of doped polysilicon. However, to reduce the gate resistance more than in this embodiment, the gate 150a may be formed of silicide.

The SBTT according to the present invention is very advantageous. First, the SBTT according to the present invention uses a Schottky barrier formed between metal and a silicon semiconductor, the Schottky barrier is made by forming the source and drain regions 160 on thin SOI layer 130 using silicide. The SBTT has improved operational characteristics because the SOI layer 130 is formed to an ultra-thin thickness so as to minimize leakage current and a channel is completely wrapped with the gate 150a and the conductive layer 150b.

Second, the SBTT according to the present invention does not adopt a doping method using ion implantation, and thus several processes related to ion implantation can be omitted, thereby reducing manufacturing costs. Also, the operational principles of the SBTT are based on quantum mechanical physics, and thus the SBTT can be applicable as a quantum device.

Third, it is possible to prevent the occurrence of a leakage current by forming source and drain regions 160 on an ultra-thin SOI substrate 130 using silicide and forming a channel region to be completely wrapped with a gate and a conductive layer. The occurrence of leakage current is regarded as being a factor that makes it the most difficult to secure the characteristics of an SBTT. Accordingly, in an SBTT using an SOI substrate and a wrap structure, according to the present invention, the occurrence of leakage current can be completely prevented, thereby increasing the practicability of the SBTT according to the present invention.

Figure 6:
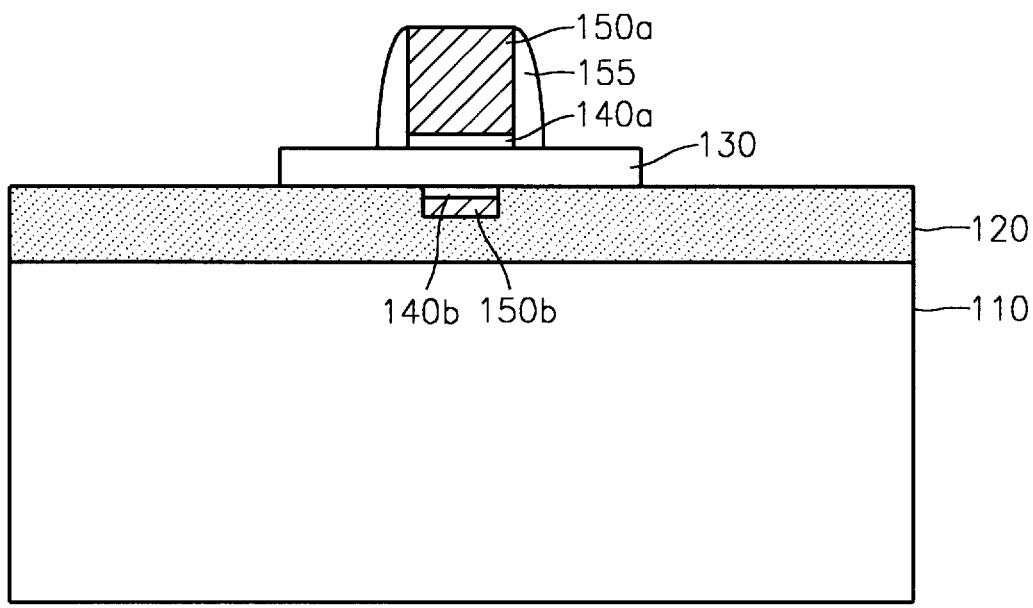
FIGS. 6 and 7 are cross-sectional views illustrating subsequent processes performed after a process explained with reference to FIG. 5A is performed.
Figure 7:
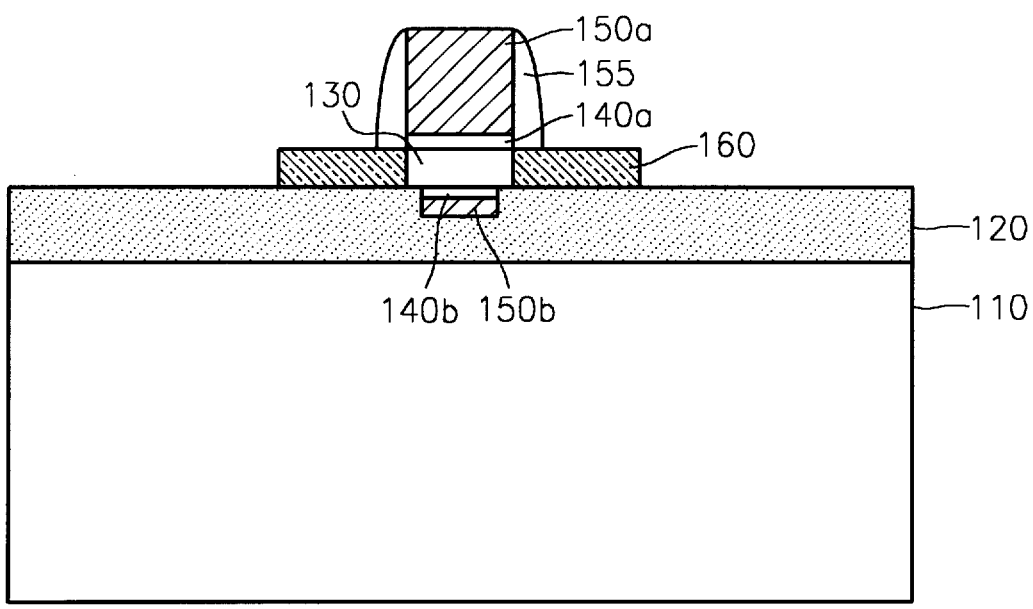

FIGS. 2A, 3A, 4A, and 5A are top views illustrating a method of fabricating an SBTT according to a preferred embodiment of the present invention. FIGS. 2B, 3B, 4B, and 5B are cross-sectional views of the SBTT shown in FIGS. 2A, 3B, 4B, and 5B, respectively, taken along the line b–b'. FIGS. 6 and 7 are cross-sectional views illustrating subsequent processes performed after a process explained with reference to FIG. 5A. A method of fabricating an SBTT according a preferred embodiment to the present invention will now be described with reference to the above drawings.

Figure 2A:
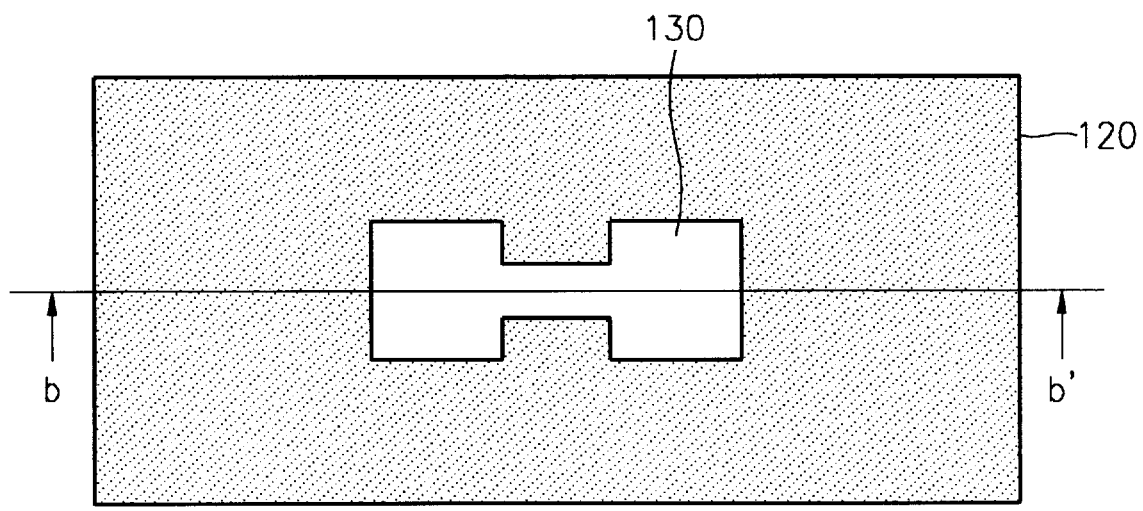
FIGS. 2A, 3A, 4A, and 5A are top views illustrating a method of fabricating an SBTT according to the present invention.
Figure 2B:
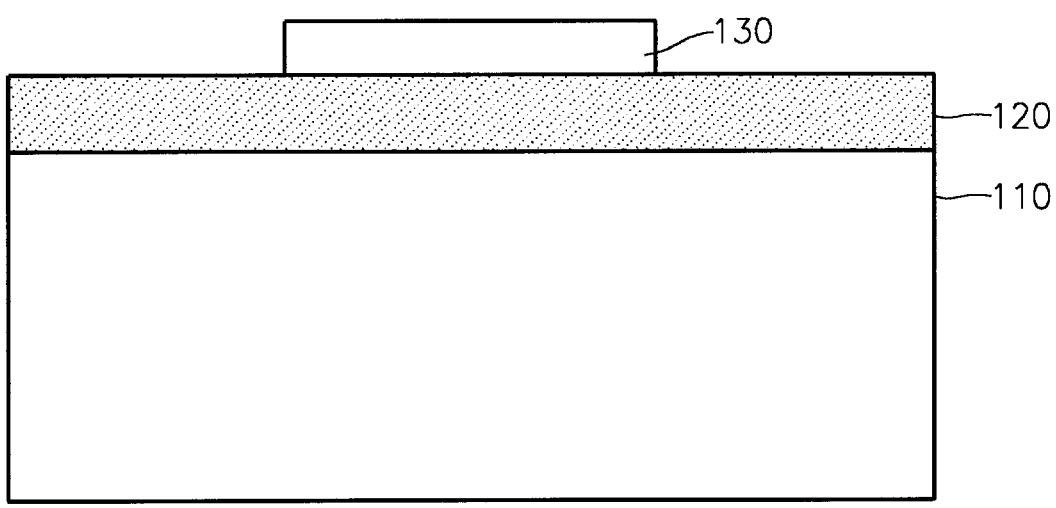
FIGS. 2B, 3B, 4B, and 5B are cross-sectional views of the SBTT shown in FIGS. 2A, 3A, 4A, and 5A, respectively, taken along the line b–b'.

Referring to FIGS. 2A and 2B, the base substrate layer 110 serves as a mechanical base frame, and a buried oxide layer 120, and an ultra-thin SOI layer 130 are sequentially formed on the substrate layer 110. The buried oxide layer 120 is typically formed of silicon dioxide and the base substrate layer 110 is usually formed of silicon. Preferably, the SOI layer 130 is formed to a thickness such that a channel can be completely controlled by an electric field that is controlled by a gate. For instance, the SOI layer 130 is formed to a thickness of 50 nm or less. Next, the SOI layer 130 is patterned to form two wide regions, which are to be source and drain regions and a narrow channel region between the two wide regions.

Figure 3A:
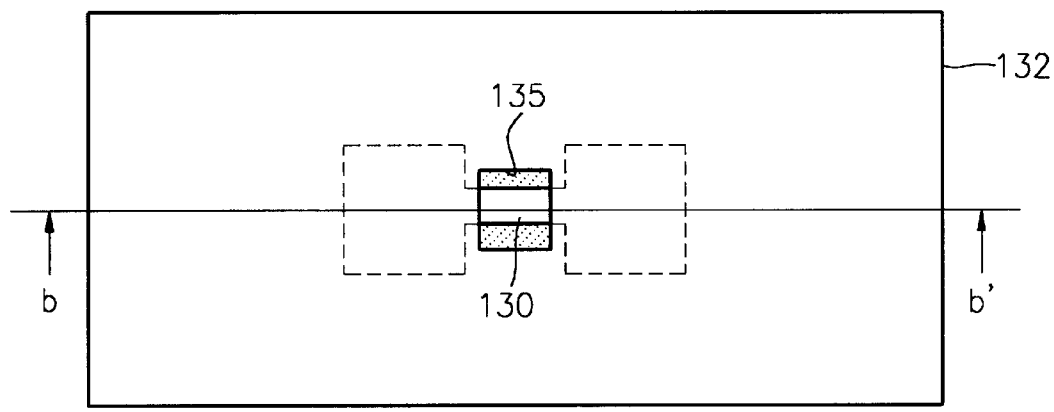
Figure 3B:
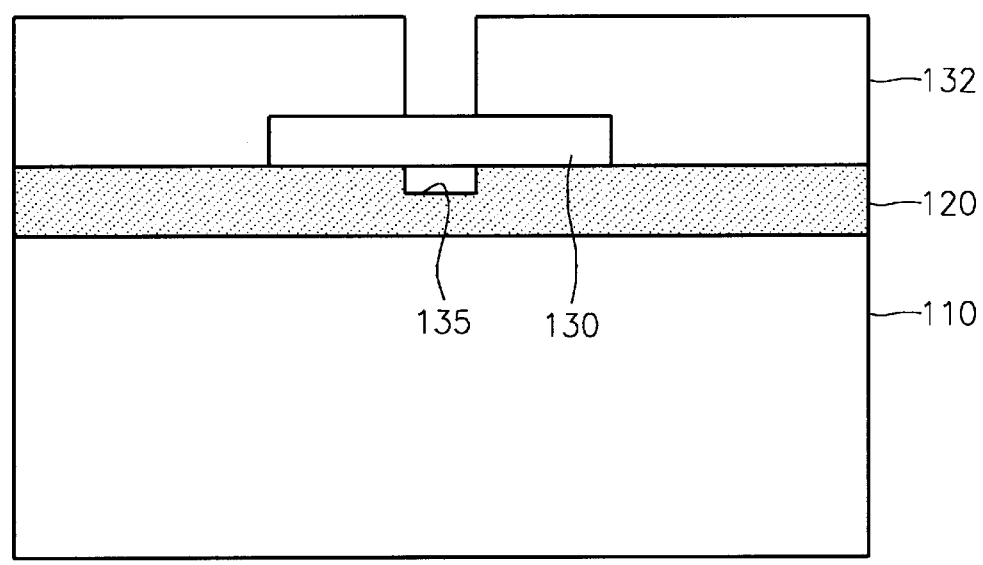

Next, as shown in FIGS. 3A and 3B, a portion of the buried oxide layer 120, which contacts the channel region of the SOI layer 130, is removed to form a groove 135. For the formation of the groove 135, a photoresist 132 is applied onto the SOI layer 130 shown in FIG. 2A. Thereafter, exposure and development are performed on the photoresist 132 to form an opening that is broader than the channel region. In this case, the photoresist 132 is removed only from a portion of the channel region, and thus the two wide regions, which are to be the source and drain regions are still completely wrapped with the photoresist 132. The opening caused by the removal of the photoresist 132 is defined to be narrower than a gate which is to be formed in the subsequent process.

Next, a portion of the buried oxide layer 120 exposed via the opening is selectively removed to a predetermined thickness with respect to the SOI layer 130, thereby forming the groove 135. For instance, the buried oxide layer 120 may be wet etched using a buffered oxide etchant (BOE) or a hydrofluoric acid (HF) solution. In this case, the SOI layer 130, which is formed of silicon, has a different etch selectivity from that of the buried oxide layer 120 which is formed of an oxide, and the SOI layer 130 is not etched during the wet etching. The photoresist 132 is applied over the entire two wide regions, which are to be the source and drain regions, prevent the removal of portions of the buried oxide layer 120, which contacts bottoms of the two wide regions and on which suicide is to be formed, during the wet etching. The removal of the buried oxide layer 120 below the two wide regions makes it difficult to form silicide on the two wide regions.

Figure 4A:
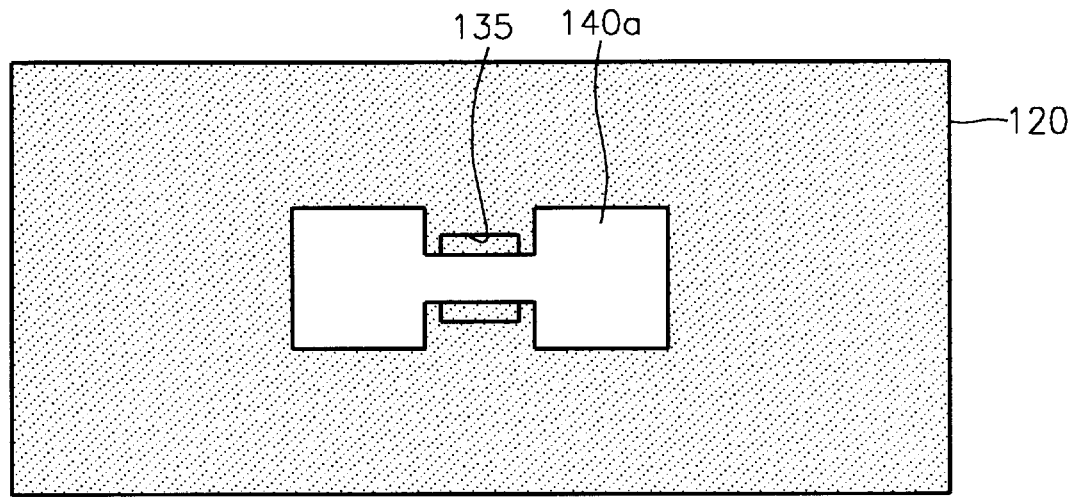
Figure 4B:
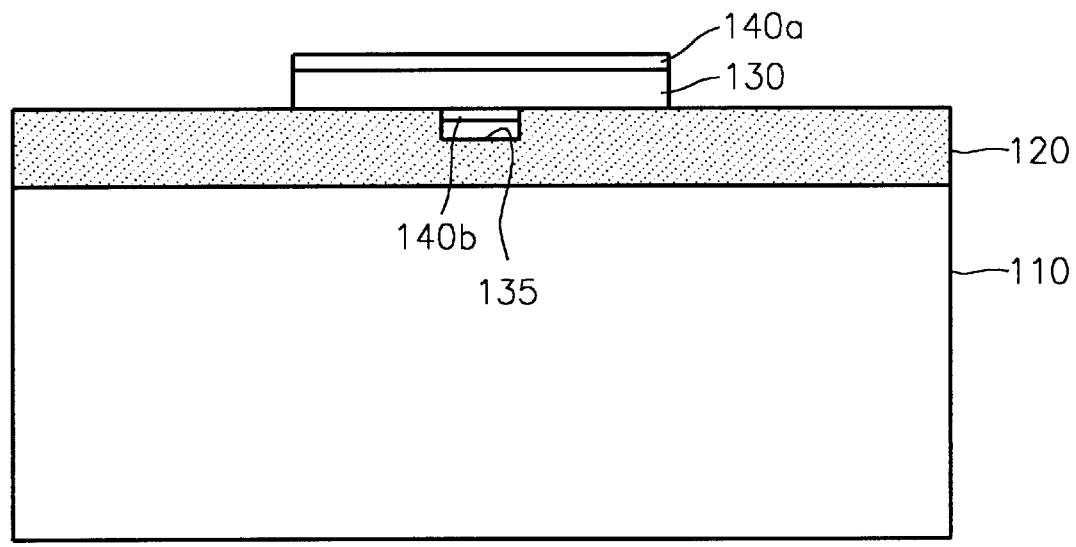

Next, referring to FIGS. 4A and 4B, the photoresist 132 is completely removed and the remaining SOI layer 130 is thermally oxidized to form the insulating layers 140a and 140b that wrap the channel region. Since the SOI layer 130 is formed across the groove 135, the thermal oxidation of the SOI layer 130 makes the exposed surfaces of the SOI layer 130 be completely wrapped by the insulating layers 140a and 140b. FIGS. 4A and 4B are a top view of and a cross-sectional view of an SBTT according to the present invention, and thus it appears that the insulating layers 140a and 140b are formed on and below the SOI layer 130. However, all surfaces of the SOI layer 130 are substantially wrapped by the insulating layers 140a and 140b.

Figure 5A:
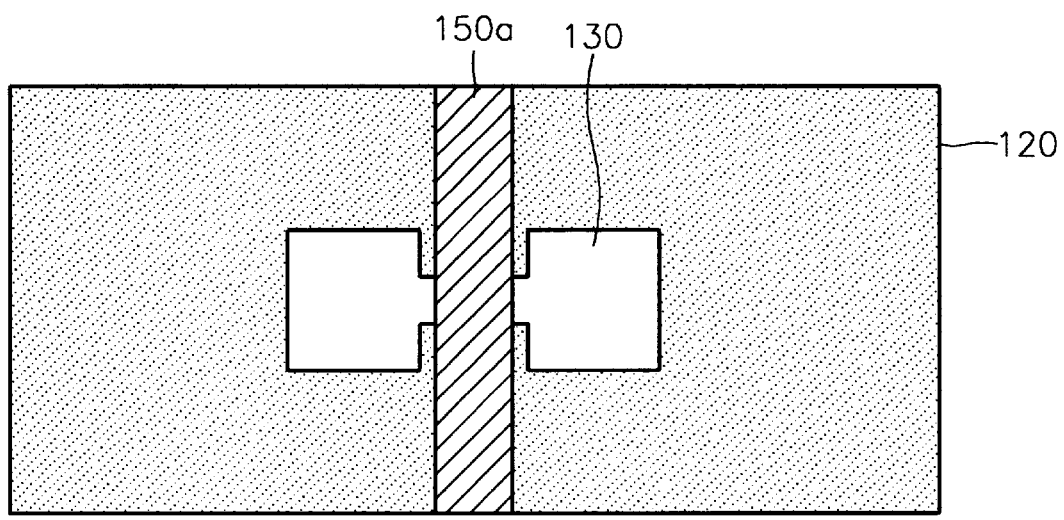
Figure 5B:
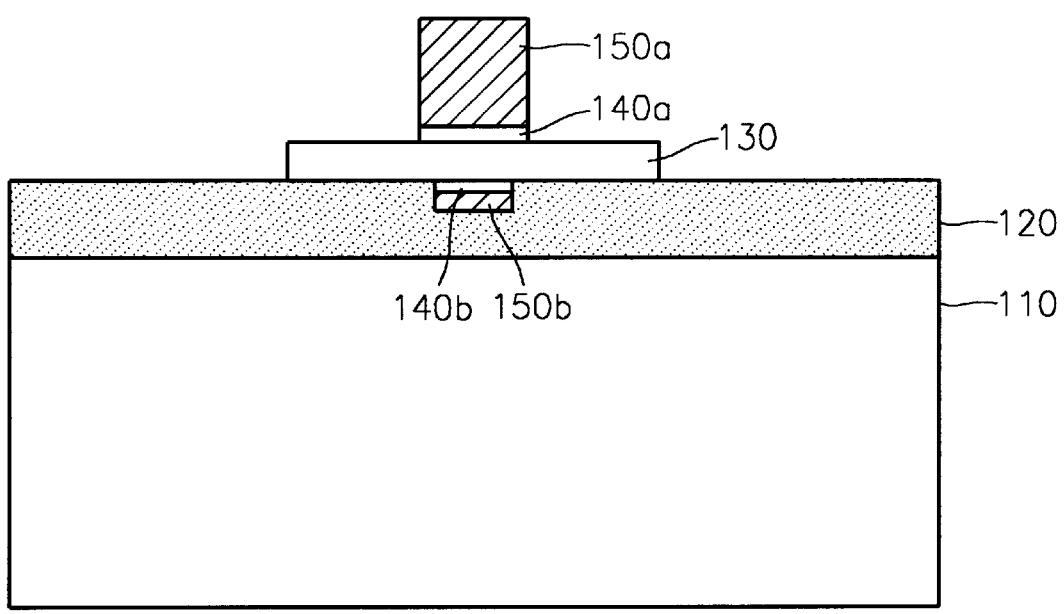

Referring to FIGS. 5A and 5B, a conductive material for a gate is deposited on the insulating layer 140a and filled in the groove 135, and the conductive material and the insulating layer 140a are patterned. As a result, the gate 150a and a gate oxide layer are formed across the channel region to be wider than the groove 135. For the formation of the gate 150a and the gate oxide layer, a hard mask layer (not shown) may be formed on the conductive material to run across the channel region and the conductive material, and the insulating layer 140a may be patterned using the hard mask layer.

It is preferable to form the conductive material for a gate of doped polysilicon. The doped polysilicon has such excellent step coverage that it is suitable for a material for filling the groove 135. Thus, if the groove 135 is filled with the doped polysilicon, a conductive layer 150b having a smooth surface is formed in the groove 135. The insulating layer 140b below the SOI layer 130 insulates the gate 150a and the conductive layer 150b. In a conventional SBTT, a leakage current between the source and drain regions is transmitted to an interface between an SOI layer and a buried oxide layer, which is positioned below a channel region. In contrast, an SBTT according to the present invention has a wrap structure in which all of the surfaces of the channel region are wrapped by the gate 150a and the conductive layer 150b, thereby completely blocking every possible leakage current paths.

Next, referring to FIG. 6, the insulating spacer 155 is formed on the sidewalls of the gate 150a. In detail, an insulating material is deposited on the resultant structure of FIG. 5B and anisotropically etched to leave the insulating material only along the sidewalls of the gate 150a, thereby forming the insulating spacer 155. The insulating spacer 155 prevents short-circuiting between the gate 150a and the source and drain regions.

Next, as shown in FIG. 7, the source and drain regions 160 are formed of silicide on the two wide regions. The source and drain regions 160 may be formed by depositing a refractory metal layer on the resultant structure of FIG. 6, on which the gate 150a is formed, and thermally treating the refractory metal layer to react the refractory metal layer with the silicon of the two wide regions. The reaction of the refractory metal layer with the silicon of the two wide regions results in the formation of a self-aligned silicide layer. For instance, the refractory metal layer may be formed of cobalt, tungsten, nickel, palladium, platinum, or titanium, and the thermal treatment may be rapid thermal annealing (RTA). During the RTA, it is preferable to obtain sufficient silicide reaction by controlling deposition thickness, and reaction temperature and time of the refractory metal layer, until the bottom of the source and drain regions 160 reach the buried oxide layer 120. A non-reacted portion of the refractory metal layer is cleansed and removed in the subsequent process. For instance, the non-reacted portion may be cleansed by performing argon (Ar) sputtering thereon in a chamber or by dipping said portion into a HF solution. During the RTA, since the gate 150a is formed to be wider than the groove 135, short-circuiting between the source and drain regions 160 and the conductive layer 150b can be prevented. Due to the insulating spacer 155 along the sidewalls of the gate 150a, short-circuiting between the gate 150a and the source and drain regions 160 can also be prevented.

Silicide reaction does not occur on the gate 150a when the hard mask layer is formed on the gate 150a, whereas silicon of the gate 150a reacts with the refractory metal layer to become suicide when the hard mask layer is not formed on the gate 150a. Silicide has a lower resistance than polysilicon, and therefore the operational speed of a transistor formed of silicide can be improved.

Using the above fabrication method, it is possible to make an SBTT according to the present invention in which the occurrence of a short channel effect and leakage current are suppressed. The SBTT according to the present invention may be easily fabricated using either a general method of fabricating a silicon transistor or spontaneous silicide reaction. The SBTT according to the present invention is advantageous in that a fabrication method is simple and has a high practicability. In particular, a fine transistor on a nanometer scale can be easily fabricated using the above fabrication method.

What is claimed is:

1. A Schottky barrier tunnel transistor (SBTT) comprising:
    a buried oxide layer formed on a base substrate layer and having a groove at its upper surface;
    an ultra-thin silicon-on-insulator (SOI) layer formed across the groove;
    an insulating layer wrapping the SOI layer on the groove;
    a gate formed to be wider than the groove on the insulating layer;
    source and drain regions each positioned at both sides of the gate, the source and drain regions formed of silicide; and
    a conductive layer for filling the groove.

2. The SBTT of claim 1, wherein the SOI layer is formed to a thickness of about 50 nm or less.

3. The SBTT of claim 1, wherein the conductive layer and the gate are formed of doped polysilicon.

4. The SBTT of claim 1, wherein the conductive layer is formed of doped polysilicon and the gate is formed of silicide.

5. The SBTT of claim 1, further comprising an insulating spacer on sidewalls of the gate.

6. The SBTT of claim 1, further comprising a hard mask layer on the gate.

7. The SBTT of claim 1, wherein the bottoms of the source and drain regions contact the buried oxide layer.

8. A method of fabricating an SBTT, comprising:
    making a substrate on which a base substrate layer, a buried oxide layer, and an ultra-thin SOI layer are sequentially formed;
    patterning the SOI layer to define two wide regions, as source and drain regions, and a narrow channel region between the two wide regions;
    forming a groove by removing a portion of the buried oxide layer that contacts the channel region;
    thermally oxidizing the remaining SOI layer to form an insulating layer, the insulating layer wrapping the channel region;
    depositing a conductive material for a gate on the insulating layer while filling the groove with the conductive material;
    patterning the conductive material and the insulating layer to form a gate and a gate oxide layer across the channel region, the gate and the gate oxide layer being formed to be wider than the groove; and
    forming source and drain regions on the two wide regions using silicide.

9. The method of claim 8, wherein the SOI layer is formed to a thickness such that an electric field controlled by the gate can completely control the channel region.

10. The method of claim 8, wherein forming a groove comprises:
    forming a photoresist on the remaining SOI layer;
    performing exposure and development on the photoresist to form an opening that is wider than the channel region;
    removing a predetermined thickness of the buried oxide layer exposed via the opening and having an etch selectivity with respect to the SOI layer; and
    removing the photoresist entirely.

11. The method of claim 8, wherein the conductive material for a gate is formed of doped polysilicon.

12. The method of claim 8, wherein forming the gate and the gate oxide layer comprises:
    forming a hard mask layer on the conductive material to be wider than the groove and across the channel region; and
    patterning the conductive material and the insulating layer using the hard mask layer.

13. The method of claim 8, further comprising, after forming the gate and the gate oxide layer, forming an insulating spacer on sidewalls of the gate.

14. The method of claim 8, wherein forming the source and drain regions comprise:
    depositing a refractory metal layer on the resultant structure on which the gate is formed; and
    forming a self-aligned silicide layer by thermally treating the substrate and reacting silicon of the two wide regions.

15. The method of claim 8, wherein the bottoms of the source and drain regions reach the buried oxide layer.

* * * * *